US012696704B2

(12) United States Patent     (10) Patent No.:   US 12,696,704 B2

Ge et al.            (45) Date of Patent:     Jul. 28, 2026

(54) TYPE OF BUMPLESS AND WIRELESS SEMICONDUCTOR DEVICE

(71) Applicant: NXP USA, INC., Austin, TX (US)

(72) Inventors: You Ge, Tianjin (CN); Zhijie Wang, Tianjin (CN); Yit Meng Lee, Kuala Lumpur (MY)

(73) Assignee: NXP USA, Inc., Austin, TX (US)

( * ) Notice: Subject to any disclaimer, the term of this patent is extended or adjusted under 35 U.S.C. 154(b) by 764 days.

(21) Appl. No.: 17/931,940

(22) Filed: Sep. 14, 2022

(65) Prior Publication Data

US 2023/0097173 A1     Mar. 30, 2023

(30) Foreign Application Priority Data

Sep. 30, 2021    (CN) .......................... 202111168327.6

(51) Int. Cl.
*H10P 54/00*     (2026.01)
*H10W 42/00*     (2026.01)
*H10W 46/00*     (2026.01)
*H10W 72/90*     (2026.01)

(52) U.S. Cl.
CPC ............. *H10P 54/00* (2026.01); *H10W 42/00* (2026.01); *H10W 42/121* (2026.01); *H10W 46/00* (2026.01); *H10W 46/503* (2026.01); *H10W 72/936* (2026.01); *H10W 72/9445* (2026.01);
(Continued)

(58) Field of Classification Search
CPC ....... H01L 24/06; H01L 21/78; H01L 23/544; H01L 23/562; H01L 23/564; H01L 23/585; H01L 2223/5446; H01L 2224/06051; H01L 2224/06135; H01L 2224/06519; H01L 23/481; H01L 2224/0557; H10P 54/00; H10W 42/00; H10W 42/121; H10W 46/00; H10W 46/503; H10W 72/936; H10W 72/9445; H10W 72/965;
(Continued)

(56) References Cited

U.S. PATENT DOCUMENTS

| 7,397,115 B2 | 7/2008 | Lee |
| 9,455,214 B2 | 9/2016 | Maling et al. |
| 9,478,580 B2 | 10/2016 | Chien-Hao et al. |

(Continued)

OTHER PUBLICATIONS

Bernstein, G., "Quilt Packaging: High-Density, High-Speed Interchip Communications", IEEE Transactions on Advanced Packaging, vol. 30, No. 4, Nov. 2007.

*Primary Examiner* — Thanh T Nguyen

(57) ABSTRACT

According to a first aspect of the present invention there is provided a semiconductor device comprising: a die having a central active region, a top surface, a bottom surface, and sidewalls having a plurality of perforations therein, each perforation extending from a top end at the top surface to a bottom end at the bottom surface; a plurality of die pads on the top surface and extending from the central active region to respective top ends; a patterned back-side-metallization layer on the bottom surface, comprising a plurality of electrically isolated regions extending to respective bottom ends; metal coating partially filling the perforations and providing electrical connection between respective ones of the plurality of die pads and respective ones of the plurality of electrically isolated regions; and a passivation layer covering the top surface and the die pads.

10 Claims, 5 Drawing Sheets

(52) U.S. Cl.
CPC ........ *H10W 72/965* (2026.01); *H10W 72/967*
(2026.01)

(58) Field of Classification Search
CPC ........... H10W 72/967; H10W 20/0238; H10W
72/942; H10W 20/20
See application file for complete search history.

(56) References Cited

U.S. PATENT DOCUMENTS

| | | | |
|---|---|---|---|
| 9,941,196 B2 | 4/2018 | Lee et al. | |
| 2006/0046468 A1 | 3/2006 | Akram et al. | |
| 2009/0140394 A1 | 6/2009 | Bathan et al. | |
| 2009/0166785 A1* | 7/2009 | Camacho | H01L 24/19 |
| | | | 257/E31.124 |
| 2010/0078655 A1* | 4/2010 | Yang | H01L 23/49816 |
| | | | 257/E33.056 |
| 2011/0097891 A1* | 4/2011 | Lee | H01L 23/481 |
| | | | 438/612 |
| 2013/0119556 A1 | 5/2013 | Lu et al. | |
| 2013/0329374 A1 | 12/2013 | Lin et al. | |
| 2014/0042604 A1 | 2/2014 | Jeon et al. | |
| 2014/0097533 A1 | 4/2014 | Liu et al. | |
| 2014/0175663 A1* | 6/2014 | Chen | H01L 23/49816 |
| | | | 257/774 |
| 2014/0183731 A1 | 7/2014 | Lin et al. | |

* cited by examiner

FIG 4

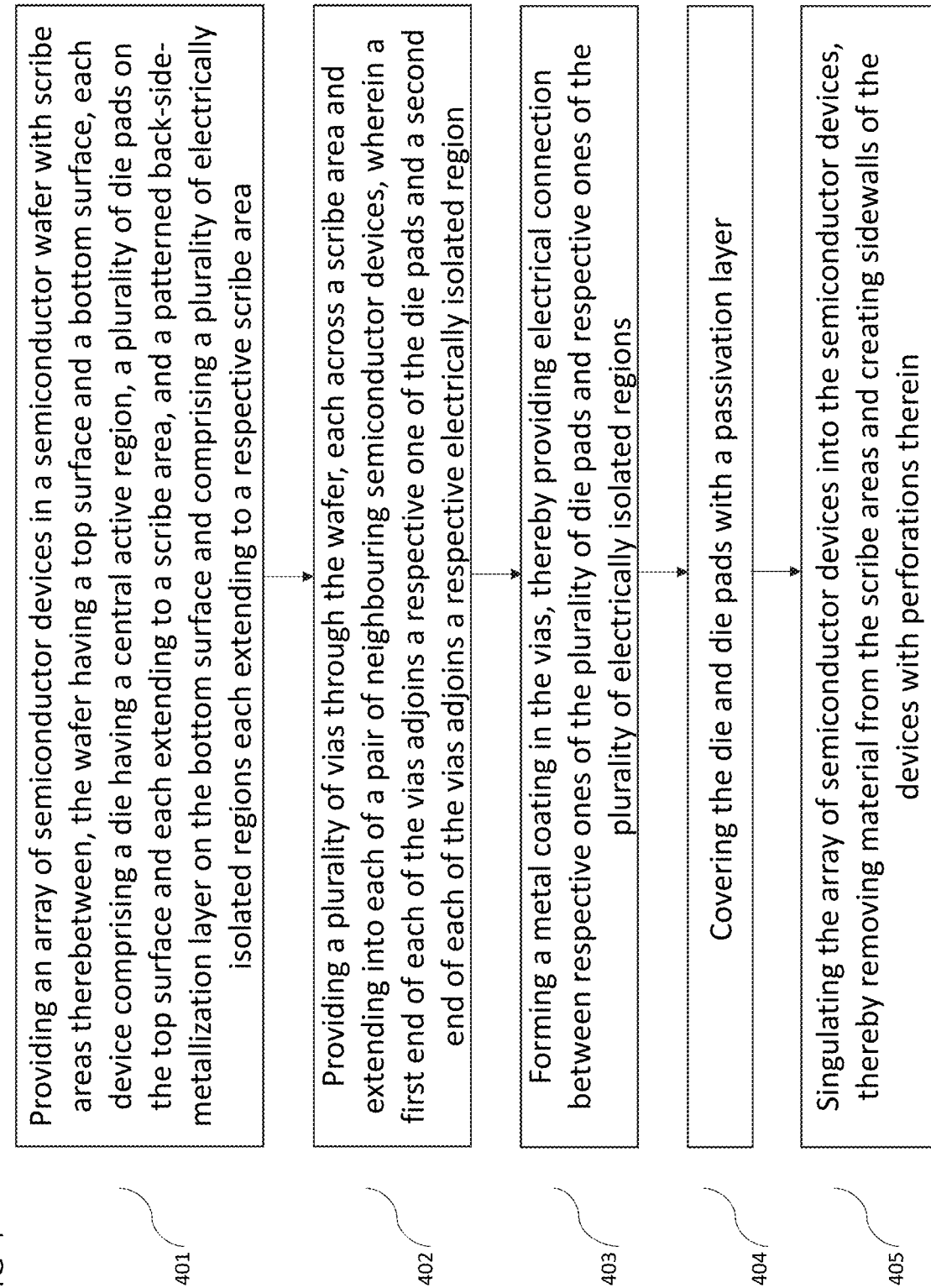

Providing an array of semiconductor devices in a semiconductor wafer with scribe areas therebetween, the wafer having a top surface and a bottom surface, each device comprising a die having a central active region, a plurality of die pads on the top surface and each extending to a scribe area, and a patterned back-side-metallization layer on the bottom surface and comprising a plurality of electrically isolated regions each extending to a respective scribe area

401

Providing a plurality of vias through the wafer, each across a scribe area and extending into each of a pair of neighbouring semiconductor devices, wherein a first end of each of the vias adjoins a respective one of the die pads and a second end of each of the vias adjoins a respective electrically isolated region

402

Forming a metal coating in the vias, thereby providing electrical connection between respective ones of the plurality of die pads and respective ones of the plurality of electrically isolated regions

403

Covering the die and die pads with a passivation layer

404

Singulating the array of semiconductor devices into the semiconductor devices, thereby removing material from the scribe areas and creating sidewalls of the devices with perforations therein

405

TYPE OF BUMPLESS AND WIRELESS SEMICONDUCTOR DEVICE

CROSS-REFERENCE TO RELATED APPLICATIONS

This application claims the priority under 35 U.S.C. § 119 of China application no. 202111168327.6, filed on 30 Sep. 2021, the contents of which are incorporated by reference herein.

FIELD

This disclosure relates to an integrated circuit (IC) packaging. More particularly, this disclosure relates to a type of bumpless and wireless chip scale semiconductor device and methods of making thereof.

BACKGROUND

The electronics industry continues to rely upon advances in semiconductor technologies to realize higher power devices in more compact areas. For many applications realizing higher power devices requires integrating a large number of electronic devices into a single silicon wafer. As the number of devices per given area of the silicon wafer increases, the manufacturing process becomes more difficult.

In existing technology, there are mainly two kinds of process to manufacture a semiconductor device. One process is a wire bonding process. The disadvantage of the wire bonding process is that the electrical efficiency is not very good because the wires are long and thin. The other process is a flip chip process. The disadvantage of the flip chip (FC) process is that the cost is quite high due to added cost of FC under ball metal (UBM) and bump process.

SUMMARY

According to one aspect of the present disclosure there is provided a semiconductor device comprising: a die having a central active region, a top surface, a bottom surface, and sidewalls having a plurality of perforations therein, each perforation extending from a top end at the top surface to a bottom end at the bottom surface; a plurality of die pads on the top surface and extending from the central active region to respective top ends; a patterned back-side-metallization layer on the bottom surface, comprising a plurality of electrically isolated regions extending to respective bottom ends; metal coating partially filling the perforations and providing electrical connection between respective ones of the plurality of die pads and respective ones of the plurality of electrically isolated regions; and a passivation layer covering the top surface and the die pads.

According to one aspect of the present disclosure there is provided a method for forming semiconductor devices, the method comprising: providing an array of semiconductor devices in a semiconductor wafer with scribe areas therebetween, the wafer having a top surface and a bottom surface, each device comprising a die having a central active region, a plurality of die pads on the top surface and each extending to a scribe area, and a patterned back-side-metallization layer on the bottom surface and comprising a plurality of electrically isolated regions each extending to a respective scribe area; providing a plurality of vias through the wafer, each across a scribe area and extending into each of a pair of neighbouring semiconductor devices, wherein a first end of each of the vias adjoins a respective one of the die pads and a second end of each of the vias adjoins a respective electrically isolated region, forming a metal coating in the vias, thereby providing electrical connection between respective ones of the plurality of die pads and respective ones of the plurality of electrically isolated regions; covering the die and die pads with a passivation layer; and singulating the array of semiconductor devices into the semiconductor devices, thereby removing material from the scribe areas and creating sidewalls of the devices with perforations therein.

In an embodiment, the semiconductor device comprises four sidewalls each of which have perforations therein.

In an embodiment, a cross-section of the perforations is a one of semi-circular, rectangular with a 2:1 aspect ratio, semi-slotted, rectangular, semi-oval, or a segment of a circle.

In an embodiment, the cross-section of the perforations is semi-circular and a diameter of the semi-circular perforations is 50-100 um.

In an embodiment, the cross-section of the perforations is semi-slotted and a long diameter of the semi-slotted perforations is 150-25 um.

In an embodiment, the patterned back-side-metallization layer further comprises an electrically isolated central region.

In an embodiment, a cross-section of the electrically isolated central region is one of square, rectangular, circular.

In an embodiment, a distance between two adjacent perforations is 0.3-0.5 mm.

In an embodiment, the electrically isolated regions of the patterned back-side-metallization layers have a width along the sidewall, of 0.15-0.25 mm and a length 0.35-0.55 mm.

In an embodiment, the patterned back-side-metallization layer comprises an alloy including at least one of following elements: Au, Ag, Cu, Al, Ni.

In an embodiment, singulating the semiconductor wafer along the modified region includes applying a temperature gradient across the semiconductor wafer or a mechanical stress to the semiconductor wafer.

This new device may be applied for high power device, due to MACRO (comparing with MICRO, the size of MACRO is larger than MICRO, which is 50 um-100 um, so it is called MACRO) TSV (Though-Silicon-Vias) and BSM (Back-Side-Metallization) with solder SMT (Surface-Mount-Technology) process. Die pads and BSM layers of the device are connected directly through MACRO TSV. That is to say, the die may be connected to circuit board directly without wires and bumps. So RC (Resistive-capacitive) delay is significant reduced. This is also low-cost solution compared with flip chip process, since a Under Ball Metal (UBM) Bump process is not required, and the die may de directly bonded to a circuit board with Solder Paste. MACRO TSV not only provides signal routing but also provides a path for heat dissipation from the semiconductor die, so this is also a thermally efficient device. Above all, this new device is much suitable for high power & RF device.

This new device may be used as a "chip scale package" since it may not include any molding compound. It may be used instead of an encapsulated package. It may have smaller footprint than the encapsulated package. It may not be as robust as the encapsulated package since it may not include any molding compound.

DESCRIPTION OF THE DRAWINGS

Embodiments of the invention will become more fully apparent from the figures in which like reference numerals identify similar or identical elements.

FIG. 4 is a flow chart of the method for forming a semiconductor device according to one embodiment of the present invention.

DETAILED DESCRIPTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
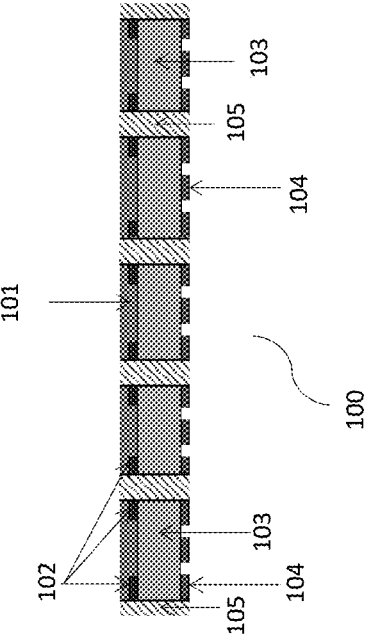
FIG. 1 is a cross-section view of a partly processed semiconductor device array according to one embodiment of the present invention.

Referring now to FIG. 1, FIG. 1 is a cross-section view of a partly processed semiconductor device array according to one embodiment of the present invention. The semiconductor device array 100 comprises 5 semiconductor devices. Each semiconductor device comprises: a passivation layer 101, a plurality of die pads 102, a die 103, a plurality of patterned BSM (back-side-metallization) layers 104. The die 103 has a central active region, a top surface, a bottom surface, and sidewalls having a plurality of perforations 105 therein. Each perforation 105 extends from a top end at the top surface to a bottom end at the bottom surface. The die pads 102 on the top surface and extends from the central active region to respective top ends. The patterned BSM layer 104 on the bottom surface comprises a plurality of electrically isolated regions extending to respective bottom ends. Metal coating partially fills the perforations 105 and provides electrical connection between respective ones of the plurality of die pads 102 and respective ones of the plurality of electrically isolated regions. The passivation layer 101 covers the top surface and the die pads 102. The die 103 may comprise four sidewalls each of which have perforations 105 therein. Alternatively, the perforations 105 may be at 1 to 4 peripheral sidewalls of the device.

Two adjacent semiconductor devices have the same and symmetric perforations 105. The same and symmetric perforations 105 are formed into a whole. A cross-section of the perforations 105 could be of any shape. For example, it may be (not limited to): semi-circular, rectangular with a 2:1 aspect ratio, semi-slotted, rectangular, semi-oval, a segment of a circle etc. The perforations 105 of two adjacent semiconductor devices is symmetrical. So, a cross-section of two adjacent perforations 105 comprise (not limited to): a circle, a square, a slot, a rectangle, an oval etc.

The passivation layer 101 may be formed of a dielectric material, such as undoped silicate glass (USG), silicon nitride, silicon oxide, silicon oxynitride or a non-porous material by any suitable method, such as CVD, PVD, or the like.

The passivation layer 101 may be a single layer or a laminated layer. The passivation layer 101 covers the die pads 102 and the die 103 for protecting them from damages.

In embodiments, the metal coating may be filled using a standard deposition process (e.g., atomic layer deposition (ALD)), plating process, sputtering processes of other conventional CVD processes. In other embodiments, the perforations are metalized with a refractory metal liner, such as a physical vapor deposition (PVD) and electroplated (ECP) step.

The patterned BSM layers 104 are metallization stacks. The patterned BSM layers 104 may be properly selected by common engineering knowledge to achieve better welding and high integrate with PCB solder pad. For example, the patterned BSM layers 104 could be alloy including at least one of following elements: Au, Ag, Cu, Al, Ni etc.

The perforations 105 allow heat or electricity to pass through from the die pads 102 to the patterned BSM layers 104. The perforations 105 not only provides signal routing but also provide a path for heat dissipation from the semiconductor die 103, so this is also a thermally efficient device.

Figure 2A:
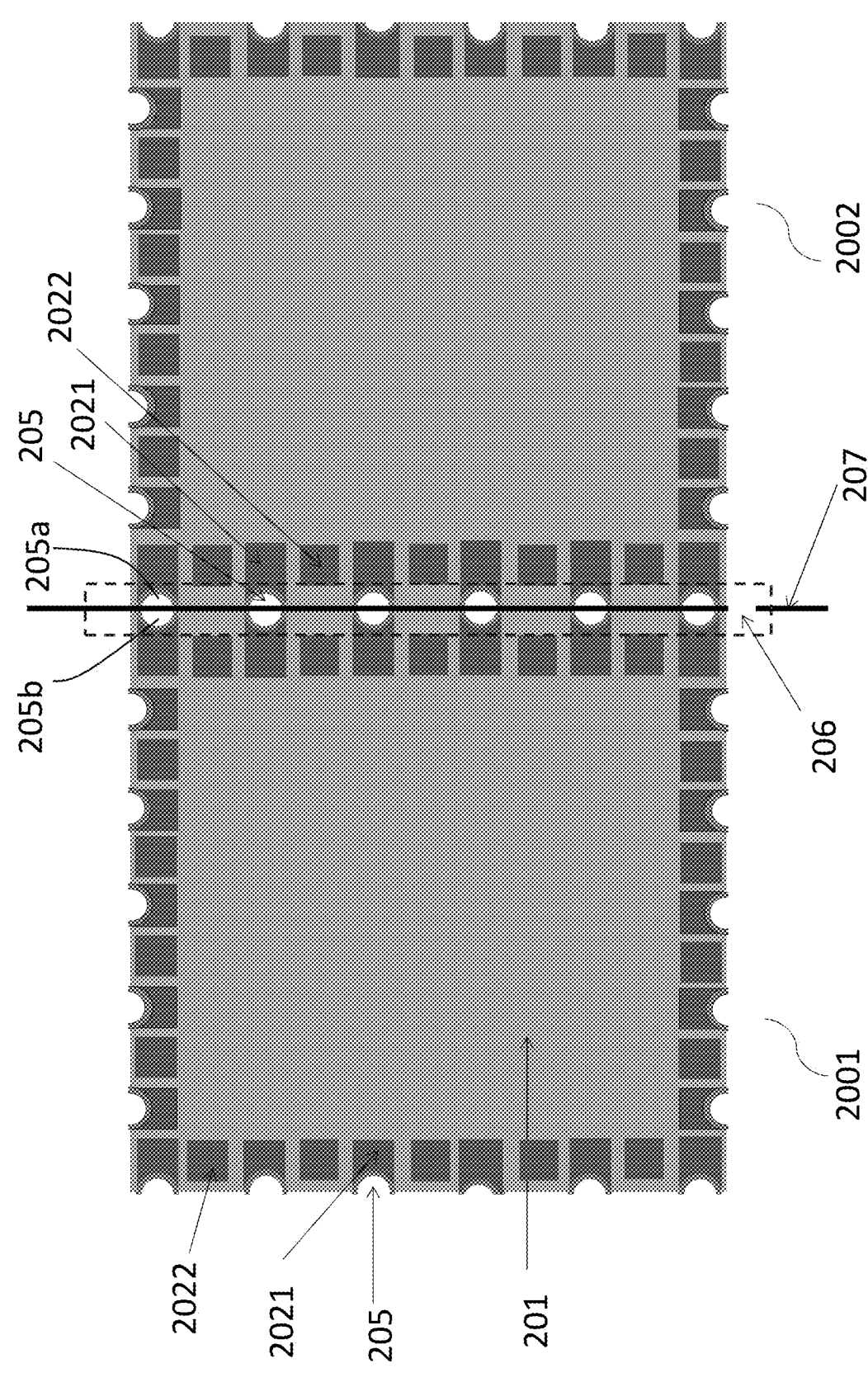
FIG. 2A is a top view of a partly processed semiconductor device array according to one embodiment of the present invention.
Figure 2B:
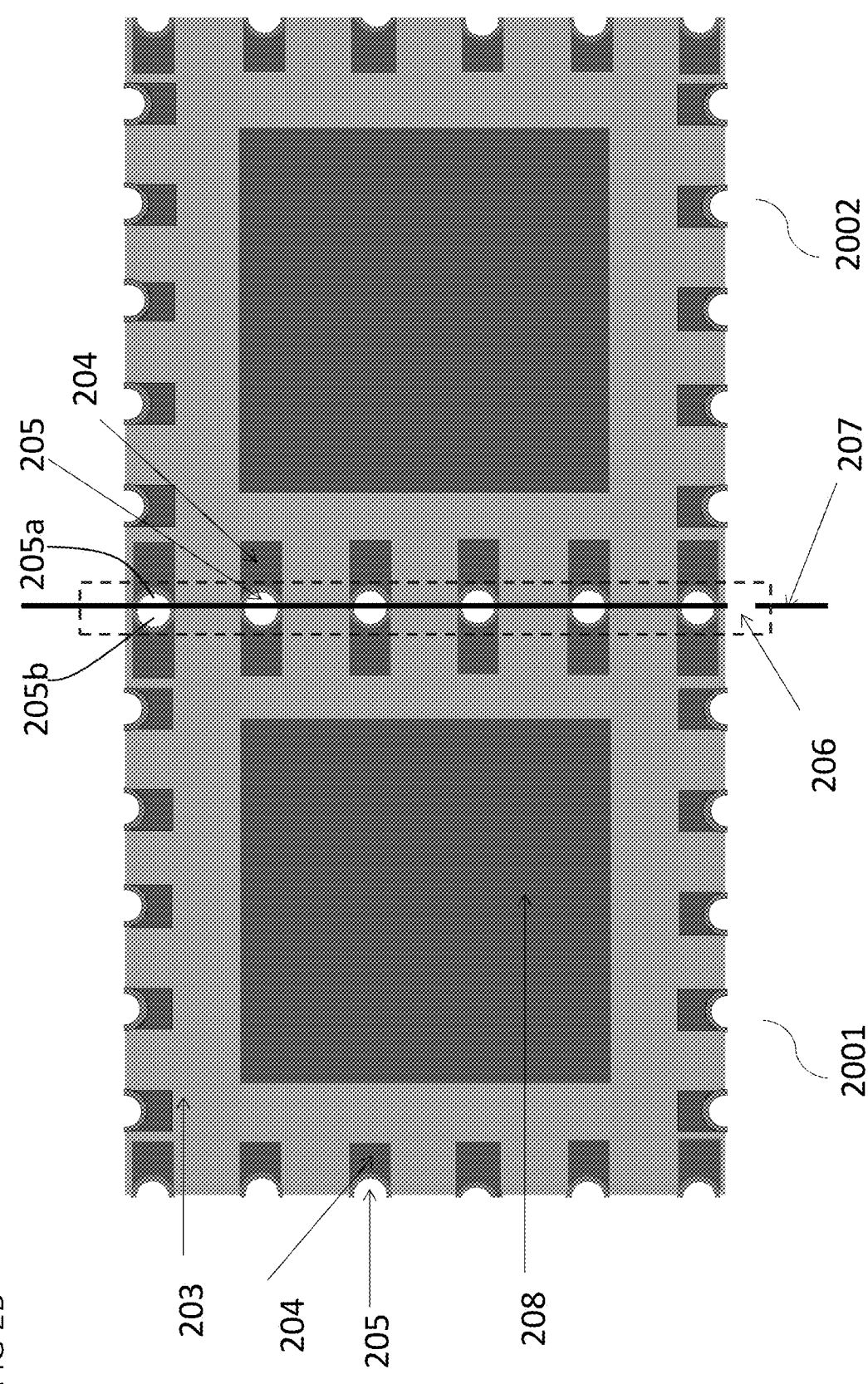
FIG. 2B is a bottom view of a partly processed semiconductor device array according to one embodiment of the present invention.

Referring now to FIGS. 2A and 2B, FIG. 2A is a top view of part of a partly processed semiconductor device array (with two devices shown) according to one embodiment of the present invention; FIG. 2B is a bottom view of part of a partly processed semiconductor device array (with two devices shown) according to one embodiment of the present invention. The structure of each semiconductor device is similar to that of each semiconductor device in array 100. The semiconductor device array comprises the two semiconductor devices as shown, a first semiconductor device 2001 and a second semiconductor device 2002. Each semiconductor device comprises: a passivation layer 201 (the passivation could be transparent), a plurality of die pads 2021, 2022, a die 203, a plurality of patterned BSM (back-side-metallization) layers 204. The die 203 has a central active region, a top surface, a bottom surface, and sidewalls having a plurality of perforations 205 therein. Each perforation 205 extends from a top end at the top surface to a bottom end at the bottom surface. Metal coating partially fills the perforations 205 and provides electrical connection between respective ones of the plurality of die pads 2021 and respective ones of the plurality of electrically isolated regions. The passivation layer 201 covers the top surface and the die pads 2022, 2022. The die 203 may comprise four sidewalls each of which have perforations 205 therein. Alternatively, the perforations 205 may be at 1 to 4 peripheral sidewalls of the semiconductor device 2001, 2002. The die pads 2021, 2022 are on the top surface of the die 203 and extends from the central active region to respective top ends. The patterned BSM layers 204 are on the bottom surface of the die 203 and extends to respective bottom ends.

There is a scribe area 206 between the first semiconductor device 2001 and the second semiconductor device 2002 as shown by a dotted Box. Part of the die pads 2021 are extended to the scribe area 206. The other part of the die pads 2022 are not extended to the scribe area 206. The extended die pads 2022 of the first semiconductor device 2001 and the second semiconductor device 2002 are respectively connected at the scribe area 206. The patterned BSM layers 204 are extended to the scribe area 206. The extended BSM layers 204 of the first semiconductor device 2001 and the second semiconductor device 2002 are respectively connected at the scribe area 206.

The perforations 205 allows heat or electricity to pass through from the die pad 2021 to the patterned BSM layers 204. There is a cutting line in the middle of the scribe area 206. The first semiconductor device 2001 and the second semiconductor device 2002 could be singulated along the cutting line 207. Before singulating along the cutting line 207, The adjacent perforations 205 are formed into a whole. A cross-section of the whole thing could be of any shape. For example, it may be (not limited to): a circle, a square, a slot, a rectangle, an oval etc. After singulating along the cutting line 207, the perforations 205 are divided into two. So, the cross-section of the perforations 205 of each semiconductor device 2001, 2002 become either of the following: semi-circular, rectangular with a 2:1 aspect ratio, semi-slotted, rectangular, semi-oval, a segment of a circle etc. If the cross-section of the perforations 205 are semi-circular perforations as shown in FIGS. 2A and 2B, a diameter of the semi-circular perforations is 50-100 um. If the cross-section of perforations 205 are semi-slotted perforations, a long diameter of the semi-slotted perforations is 150-250 um. The patterned back-side-metallization 204 layer may further comprise an electrically isolated central region 208. A cross-section of the electrically isolated central region 208 may be of any shape, such as square, rectangular, circular etc. The electrically isolated central region 208 forms the die level "exposed pad" device structure for better thermal dissipation.

The distance between two adjacent perforations is 0.3-0.5 mm. The electrically isolated regions 208 of the patterned back-side-metallization layers 204 have a width along the sidewall, of 0.15-0.25 mm and a length 0.35-0.55 mm. The patterned BSM layers 204 may be properly selected per common engineering knowledge to achieve better welding and high integrate with PCB solder pad.

For example, it may be (not limited to) alloy including at least one of following elements: Au, Ag, Cu, Al, Ni etc. The device of the embodiment is also a high thermal dissipation device, due to solder and EP application under die backside.

Compare with Flip Chip (FC), the device of the embodiment has FC advantages, such as low RC delay and good thermal performance, In the meanwhile it may get rid of challenges related with FC, such as UBM stress, induced passivation crack.

Compare with Wire Bonding (WB), connection convert to die backside, the device of the embodiment reduces bond pad crack and cratering issue. No physical collision & USG energy induces damage. Electrical performance at high frequency application is better than WB interconnection.

Figure 3:
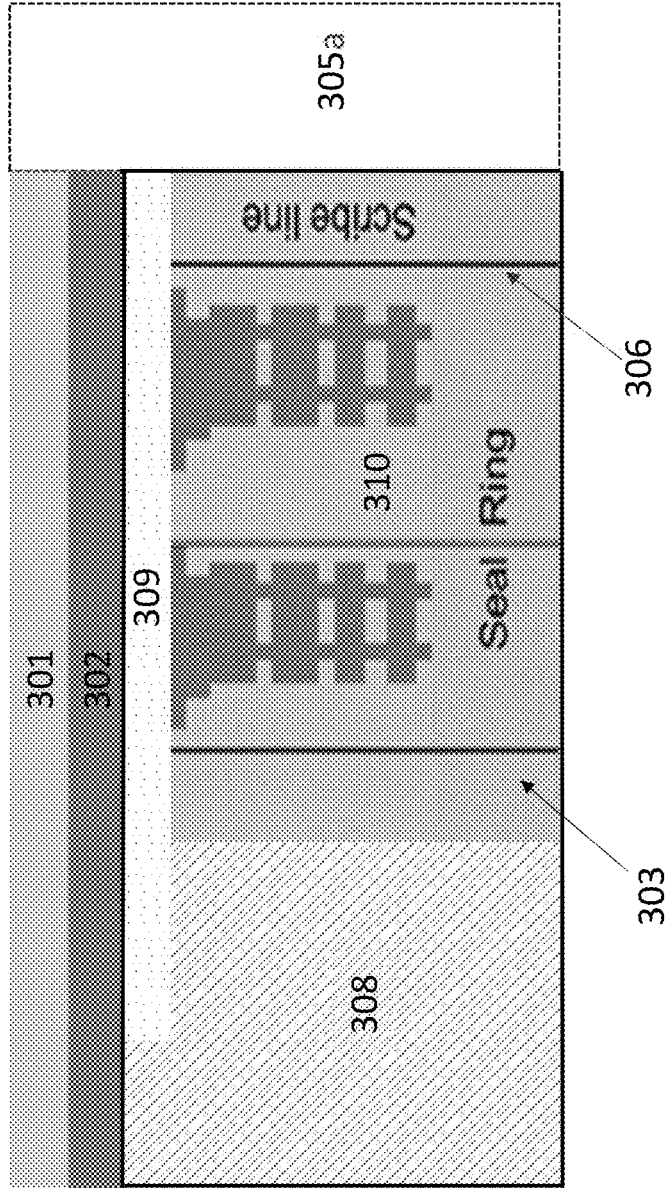
FIG. 3 is a cross-section view of a partly processed semiconductor device according to one embodiment of the present invention.

Referring now to FIG. 3 is a cross-section view of a partly processed semiconductor device according to one embodiment of the present invention.

The semiconductor device comprises a passivation layer 301, a die pad 302, a die 303 including an active region 308, an inter-layer dielectric (ILD) layer 309, an inactive region 310, a sidewall having a perforation 305 therein. There is a seal ring in the seal area within the inactive region 310. There is a scribe line in the scribe area 306. The ILD layer 309 covers the seal area and extends to the scribe area 306.

The die pad 302 and passivation layer 301 also extend to the scribe area 306. The scribe area 306 may have deposit pattern. The die pad 302 may be a conventional metal layer such as bond pad layer on top of a conventional die which are extended and repurposed. The die pad 302 may be metal such as Al, Cu, Ag, Au etc. or alloy including Al, Cu, Ag, Au and so on. The thickness of the die pad may be 0.1-1 mm, and 0.5 mm is preferred.

Referring now to FIG. 4, a flow chart of the method for forming a semiconductor device, the method comprises: 401 providing an array of semiconductor devices in a semiconductor wafer with scribe areas therebetween, the wafer having a top surface and a bottom surface, each device comprising a die having a central active region, a plurality of die pads on the top surface and each extending to a scribe area, and a patterned back-side-metallization layer on the bottom surface and comprising a plurality of electrically isolated regions each extending to a respective scribe area; 402 providing a plurality of vias through the wafer, each across a scribe area and extending into each of a pair of neighbouring semiconductor devices, wherein a first end of each of the vias adjoins a respective one of the die pads and a second end of each of the vias adjoins a respective electrically isolated region; 403 forming a metal coating in the vias, thereby providing electrical connection between respective ones of the plurality of die pads and respective ones of the plurality of electrically isolated regions; 404 covering the die and die pads with a passivation layer; and 405 singulating the array of semiconductor devices into the semiconductor devices, thereby removing material from the scribe areas and creating sidewalls of the devices with perforations therein.

The method may comprise creating four sidewalls of the devices with perforations. A cross-section of the perforations is a one of semi-circular, rectangular with a 2:1 aspect ratio, semi-slotted, rectangular, semi-oval, or a segment of a circle. If the cross-section of the perforations are semi-circular and a diameter of the semi-circular perforations is 50-100 um. If the cross-section of the perforations are semi-slotted and a long diameter of the semi-slotted perforations is 150-250 um. The patterned back-side-metallization layer further comprises an electrically isolated central region. A cross-section of the electrically isolated central region may be of any shape, for example, it may be one of square, rectangular, circular. The distance between two adjacent perforations is 0.3-0.5 mm. The electrically isolated regions of the patterned back-side-metallization layers have a width along the sidewall, of 0.15-0.25 mm and a length 0.35-0.55 mm. The ways of singulating the semiconductor wafer along the modified region includes applying a temperature gradient across the semiconductor wafer or a mechanical stress to the semiconductor wafer, such as sawing, scribing and laser-cutting etc.

The electrically isolated central region forms the die level "exposed pad" device structure for better thermal dissipation. The patterned back-side-metallization layers may be properly selected per common engineering knowledge to achieve better welding and high integrate with PCB solder pad.

For example, it may be (not limited to) alloy including at least one of following elements: Au, Ag, Cu, Al, Ni etc. Electroless plating process flow may be applied either for patterned BSM.

After singulating the array of semiconductor devices into the semiconductor devices, thereby removing material from the scribe areas and creating sidewalls of the devices with perforations therein, the method may directly apply for SMT process. No other B/E assembly process is needed.

Any range or device value given herein may be extended or altered without losing the effect sought, as will be apparent to the skilled person.

Although the invention has been described in the context of IC devices having a single die and a single electrical connector, it will be understood that the invention can be implemented in the context of IC devices having any suitable numbers of dies and any suitable numbers of electrical connectors.

Also, for purposes of this description, the terms "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Unless explicitly stated otherwise, each numerical value and range should be interpreted as being approximate as if the word "about" or "approximately" preceded the value or range.

It will be understood that various changes in the details, materials, and arrangements of the parts which have been described and illustrated in order to explain embodiments of this invention may be made by those skilled in the art without departing from embodiments of the invention encompassed by the following claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. A semiconductor device comprising:
   a die having a central active region,
      a top surface,
      a bottom surface,
      and sidewalls having a plurality of perforations therein, each perforation extending from a top end at the top surface to a bottom end at the bottom surface;
   a plurality of die pads on the top surface and extending from the central active region to respective top ends;
   a patterned back-side-metallization layer on the bottom surface, comprising a plurality of electrically isolated regions extending to respective bottom ends;
   metal coating partially filling the perforations and providing electrical connection between respective ones of the plurality of die pads and respective ones of the plurality of electrically isolated regions; and
   a passivation layer covering the top surface and the die pads.

2. The semiconductor device of claim 1, comprising four sidewalls each of which have perforations therein.

3. The semiconductor device of claim 1, wherein a cross-section of the perforations is a one of semi-circular, rectangular with a 2:1 aspect ratio, semi-slotted, rectangular, semi-oval, or a segment of a circle.

4. The semiconductor device of claim 2, wherein the cross-section of the perforations is semi-circular and a diameter of the semi-circular perforations is 50-100 um.

5. The semiconductor device of claim 2, wherein the cross-section of the perforations is semi-slotted and a long diameter of the semi-slotted perforations is 150-250 um.

6. The semiconductor device of claim 1, wherein the patterned back-side-metallization layer further comprises an electrically isolated central region.

7. The semiconductor device of claim 6, wherein a cross-section of the electrically isolated central region is one of square, rectangular, circular.

8. The semiconductor device of claim 1, wherein a distance between two adjacent perforations is 0.3-0.5 mm.

9. The semiconductor device of claim 1, wherein the electrically isolated regions of the patterned back-side-metallization layers have a width along the sidewall, of 0.15-0.25 mm and a length 0.35-0.55 mm.

10. The semiconductor device of claim 1, wherein the patterned back-side-metallization layer comprises an alloy including at least one of following elements: Au, Ag, Cu, Al, Ni.

* * * * *